United States Patent [19]

Eberhardt et al.

[11] Patent Number: 5,751,549
[45] Date of Patent: May 12, 1998

[54] HARD DISK DRIVE ASSEMBLY WHICH HAS A PLENUM CHAMBER AND A FAN ASSEMBLY THAT IS PERPENDICULAR TO A RACK CHAMBER

[75] Inventors: Anthony N. Eberhardt, Los Gatos; William L. Dailey, Redwood City; John A. Harada, San Francisco, all of Calif.

[73] Assignee: Sun Microsystems, Inc., Mountain View, Calif.

[21] Appl. No.: 670,976

[22] Filed: Jun. 26, 1996

[51] Int. Cl.$^6$ .................. G06F 1/20; H05K 7/20
[52] U.S. Cl. .................. 361/687; 361/685; 361/695
[58] Field of Search .................. 236/49.3; 364/708.1; 361/687, 688, 685, 692–695

[56] References Cited

U.S. PATENT DOCUMENTS

| | | | |
|---|---|---|---|
| 4,126,269 | 11/1978 | Bruges | 236/49.3 |
| 4,756,473 | 7/1988 | Takemae et al. | 236/49.3 |
| 4,817,865 | 4/1989 | Wray | 236/49.3 |
| 5,102,040 | 4/1992 | Harvey | 236/49.3 |
| 5,119,497 | 6/1992 | Freige et al. | 361/685 X |
| 5,193,050 | 3/1993 | Dimmick et al. | 361/694 |
| 5,204,497 | 4/1993 | Herrick | 361/687 X |
| 5,222,897 | 6/1993 | Collins | 361/685 X |
| 5,247,427 | 9/1993 | Driscoll et al. | 361/685 |
| 5,249,741 | 10/1993 | Bistline et al. | 236/49.3 |
| 5,435,737 | 7/1995 | Haga et al. | 361/685 X |
| 5,436,827 | 7/1995 | Gunn et al. | 361/695 X |
| 5,474,120 | 12/1995 | Severson et al. | 236/49.3 |
| 5,526,289 | 6/1996 | Dihn et al. | 361/695 X |
| 5,579,204 | 11/1996 | Nelson et al. | 361/685 |

*Primary Examiner*—Michael W. Phillips
*Attorney, Agent, or Firm*—Blakely Sokoloff Taylor & Zafman

[57] ABSTRACT

An electrical assembly that allows a plurality of electronic assemblies to be cooled by a number of fans. The assembly includes a housing which has a plenum chamber that is located between a rack chamber and a fan chamber. The rack chamber is separated from the plenum chamber by a backbone wall. The fan chamber is separated from the plenum chamber by a fan wall that is perpendicular to the backbone wall. The rack chamber contains a plurality of electronic assemblies such as hard disk drives. The fan chamber contains a plurality of individual fans. The fans induce an air flow from the rack chamber to the fan chamber through the plenum chamber. The plenum chamber provides a uniform pressure that induces an equal flow rate across each disk drive in the rack chamber. The fans are controlled by a control circuit which can detect the failure of one fan and increase the speed of the remaining fans to maintain the plenum chamber pressure. The constant plenum chamber pressure insures an equal flowrate across each disk drive even when one of the fans fails.

11 Claims, 3 Drawing Sheets

HARD DISK DRIVE ASSEMBLY WHICH HAS A PLENUM CHAMBER AND A FAN ASSEMBLY THAT IS PERPENDICULAR TO A RACK CHAMBER

BACKGROUND OF THE INVENTION

1. Field of the Invention

The present invention relates to an apparatus and method for cooling a plurality of electronic assemblies.

2. Description of Related Art

Hard disk drives are sometimes packaged in a single housing and linked together by a common back plane circuit board to provide a large block of memory for an external computer system. The disk drives are typically plugged into mating electrical connectors mounted to the surface of the back plane. The housing may have fans that remove heat generated by the disk drives. The fans are located within the housing to generate an air flow directly across the outer surface of the disk drives. Each fan is typically dedicated to a group of adjacent disk drives.

Catastrophic failure of a fan may cause the group of disk drives dedicated to the fan to overheat. Merely increasing the fan speed of the remaining fans may not sufficiently cool the disk drive because the air flow of the other fans is not directed toward the overheated drives. It would be desirable to provide an electrical assembly that will adequately cool a plurality of electronic assemblies with a number of fans even if one of the fans fails.

SUMMARY OF THE INVENTION

The present invention is an electrical assembly that allows a plurality of electronic assemblies to be cooled by a number of fans. The assembly includes a housing which has a plenum chamber that is located between a rack chamber and a fan chamber. The rack chamber is separated from the plenum chamber by a backbone wall. The fan chamber is separated from the plenum chamber by a fan wall that is perpendicular to the backbone wall. The rack chamber contains a plurality of electronic assemblies such as hard disk drives. The fan chamber contains a plurality of individual fans. The fans induce an air flow from the rack chamber to the fan chamber through the plenum chamber. The plenum chamber provides a uniform pressure that induces an equal flow rate across each disk drive in the rack chamber. The fans are controlled by a control circuit which can detect the failure of one fan and increase the speed of the remaining fans to maintain the plenum chamber pressure. The constant plenum chamber pressure insures an equal flowrate across each disk drive even when one of the fans fails.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
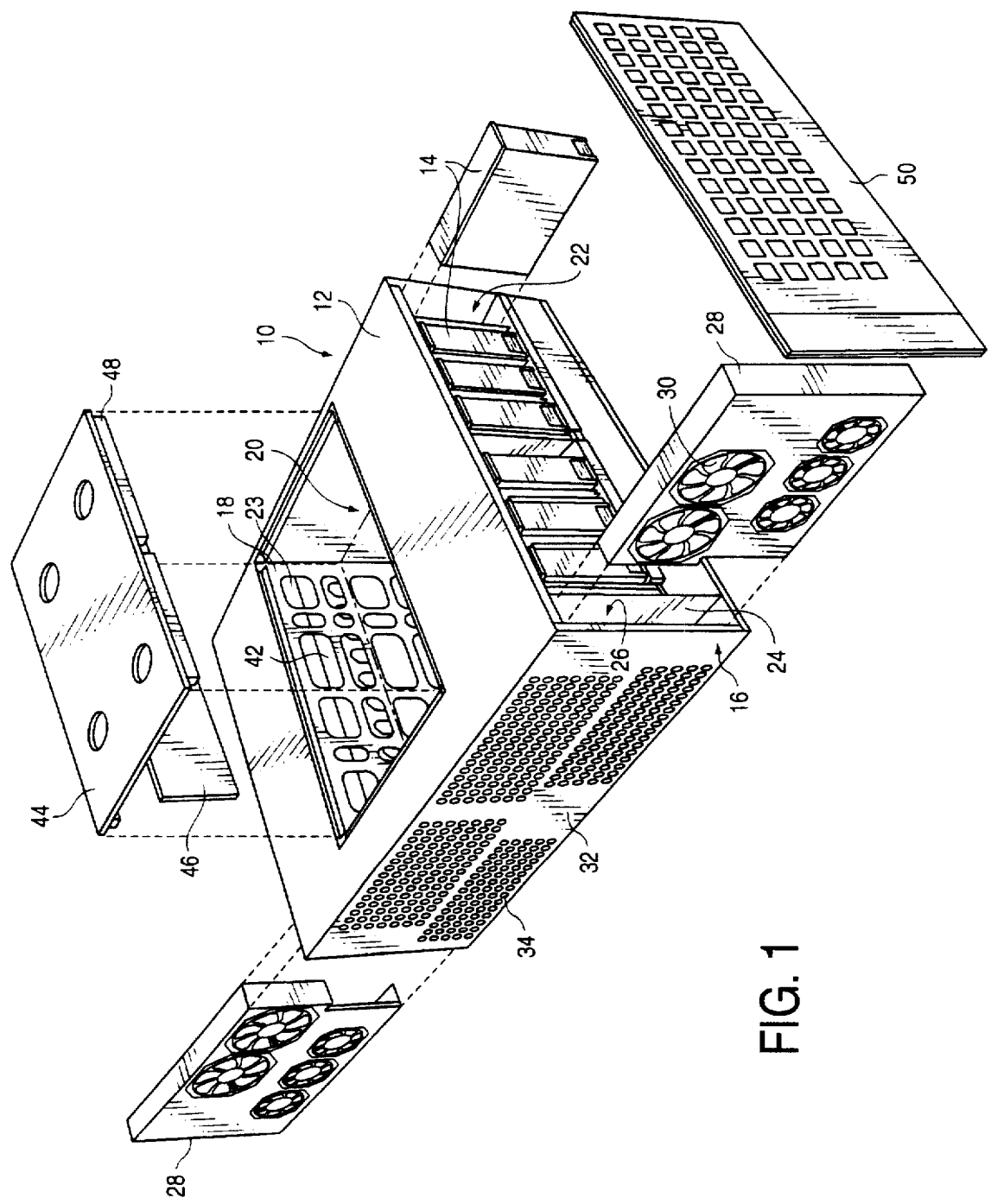
FIG. 1 is an exploded perspective view of an electrical assembly of the present invention.

Referring to the drawings more particularly by reference numbers, FIG. 1 shows an electrical assembly 10 of the present invention. The assembly 10 includes a housing 12 which holds a plurality of electronic subassemblies 14. In the preferred embodiment, the electronic subassemblies 14 are hard disk drive units. Although hard disk drives are shown and described, it is to be understood that the individual devices may be any electronic subassembly such as a plurality of memory cards.

The housing 12 includes a chassis 16 that is typically a metal sheet(s) stamped and bent into the form shown. The chassis 16 has a pair of backbone walls 18 which separate a plenum chamber 20 from a pair of disk rack chambers 22. The rack chambers 22 contain the disk drives 14. The backbone walls 18 have openings 23 which allow fluid communication between the disk rack chambers 22 and the plenum chamber 20.

The chassis 16 also has a fan side wall 24 that separates a fan chamber 26 from the rack chambers 22. The assembly 10 includes a pair of fan subassemblies 28 that slide into the fan chamber 26. The subassemblies 28 each contain a plurality of individual fans 30. The chassis 16 has an outer fan wall 32 which has a plurality of grill openings 34 that provide fluid communication between the fan chamber 26 and the surrounding ambient.

Figure 2:
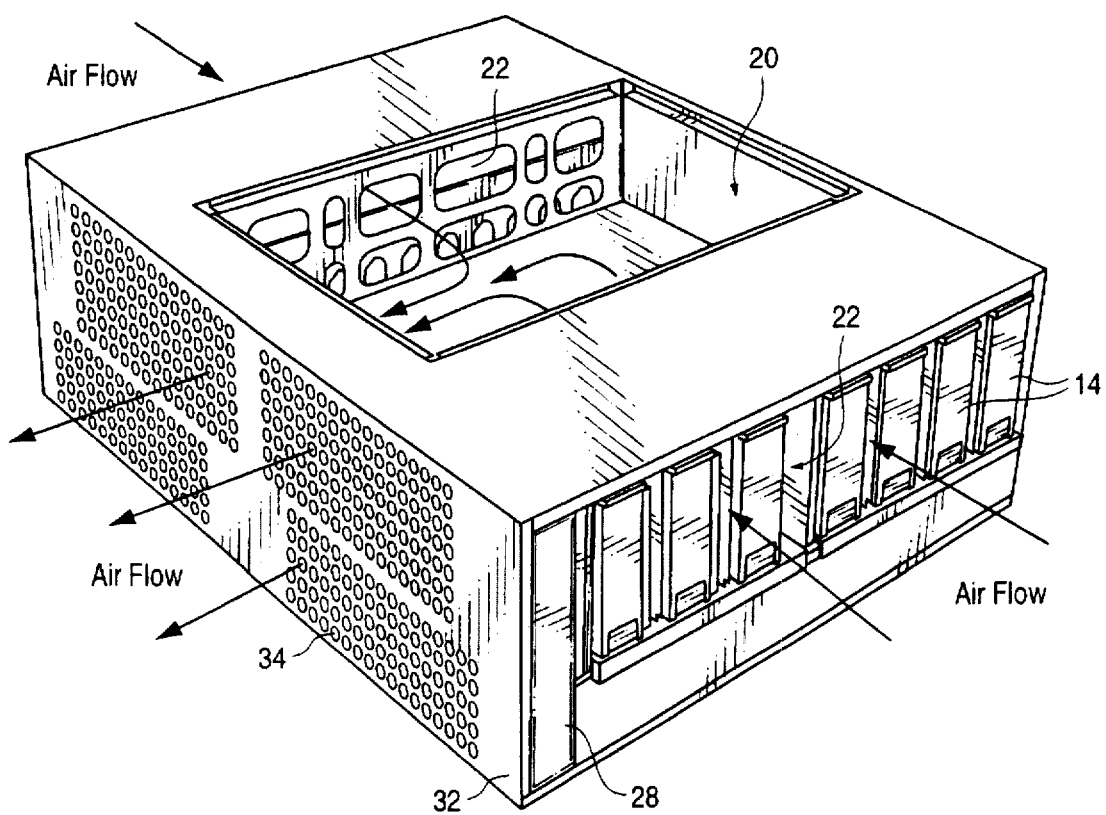
FIG. 2 is a perspective view showing air flowing through the assembly.

As shown in FIG. 2, the fans 30 blow air from the fan chamber 26 to the ambient through the grill openings 34 of the outer wall 32. The fans 30 also draw air into the fan chamber 26 from the plenum chamber 20. The flow of air into the fan chamber 26 creates a negative pressure within the plenum chamber 20. The negative pressure within the plenum chamber 20 draws air in from the disk rack chambers 22 to create uniform flow across all the hard disk drives 14.

The plenum chamber 20 provides a reservoir of negative pressure which induces equal flowrates across each disk drive 14 of the assembly. The equal flowrates provide each disk drive with approximately the same heat transfer rate, thereby preventing "hot spots" in the assembly. The flowrates are equal regardless of how many disk drives are plugged into the assembly. The addition or removal of disk units does not significantly vary the flowrate through the rack chambers 22 and the heat transfer rate of the drives. Additionally, the plenum provides the same pressure for each disk rack 22 even if one of the fans 30 within the fan chamber 26 fails.

Figure 3:
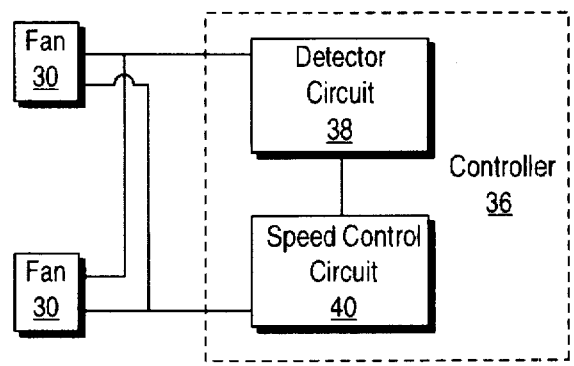
FIG. 3 is a schematic of a fan controller of the assembly.

As shown in FIG. 3, the assembly 10 may have a fan controller 36 that detects a failure of a fan 30 and then increases the speed of the remaining fans 30 to maintain the pressure within said plenum chamber 20 at a relatively constant level. The controller 36 may have a detection circuit 38 that is coupled to a speed control circuit 40. The speed control circuit 40 increases the speed of the fans 30 in response to an active input signal from the detection circuit 38. The detection circuit 38 may detect the speed of each fan 30. If the speed of a fan falls below a threshold value, the detection circuit 38 may provide an active input signal to a control circuit 40. The control circuit 40 then increases the fan speed by increasing the voltage provided to the fans 30. By way of example, the control circuit 40 may increase the voltage to the fans from 9 volts to 12 volts. The combination of the plenum chamber 20 and the varying fan speeds creates a system that provides relatively constant air flow across the disk drives 14 even when a fan 30 fails.

Referring to FIG. 1, the assembly 10 may include a pair of backbone printed circuit boards 42 that are located adjacent to the backbone walls of the chassis 18. The disk drives 14 have external electrical connectors (not shown)

that are plugged into mating connectors (not shown) mounted to the backbone board 42. The mating connectors allow an end user to attach and unplug the disk drives 14 from the assembly.

The backbone circuit boards 42 of each disk rack chamber 22 are plugged into an interconnect printed circuit board 44 located within the plenum chamber 20. The interconnect circuit board 44 has a spacer 46 which raises the board 44 from the base of the chassis 16 so that electrical connectors 48 can be plugged into corresponding connectors (not shown) of the backbone circuit board 42 without cables.

Figure 4:
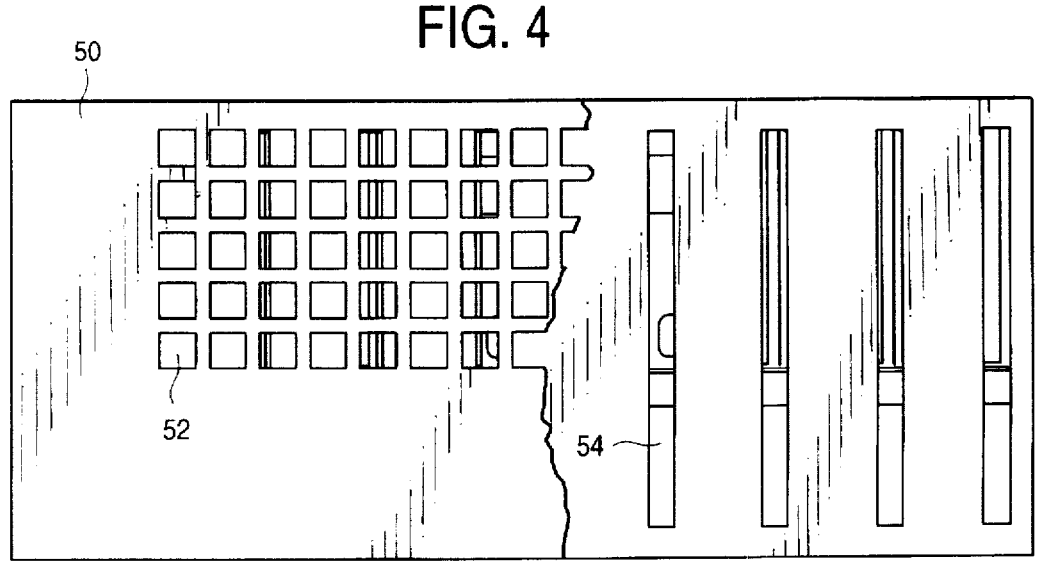
FIG. 4 is a front sectional view of a panel of the assembly.

The assembly 10 may have a pair of side outer panels 50 that enclose the disk drives 14 and fan subassemblies 28. As shown in FIG. 4, the panels 50 may have a plurality of outer grill openings 52 and a plurality of inner slots 54. The inner slots 54 are aligned with the spaces between the disk drives 14.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An electrical assembly, comprising:
   a housing which has a rack chamber that is separated from a plenum chamber by a backbone wall which has an opening, and a fan side wall which separates a fan chamber from said plenum chamber, said fan side wall has both an opening and is perpendicular to said backbone wall;
   an electronic assembly that is located within said rack chamber; and,
   a fan that is located within said fan chamber, said fan induces an air flow from said rack chamber to said plenum chamber and from said plenum chamber to said fan chamber.

2. The assembly as recited in claim 1, wherein said electronic assembly is a hard disk drive.

3. The assembly as recited in claim 2, further comprising a backbone printed circuit board that is mounted to said backbone wall and coupled to said hard disk drive.

4. The assembly as recited in claim 3, further comprising an interconnect printed circuit board that is located in said plenum chamber and coupled to said backbone printed circuit board.

5. The assembly as recited in claim 2, further comprising a panel that encloses a pair of hard disk drives that are separated from each other by a space, said panel having a slot that is aligned with said space.

6. The assembly as recited in claim 1, further comprising a fan controller that varies a speed of said fan.

7. A hard disk drive assembly, comprising:
   a housing which has a backbone wall that separates a plenum chamber from a disk rack chamber, and a fan side wall that separates said plenum chamber from a fan chamber, said backbone wall and said fan side wall have openings that provide fluid communication between said disk rack chamber, said plenum chamber and said fan chamber, said fan side wall being perpendicular to said backbone wall;
   a plurality of hard disk drives that are located within said disk rack chamber; and,
   a plurality of fans that are located within said fan chamber, said fans induce an air flow from said disk rack chamber to said plenum chamber and from said plenum chamber to said fan chamber.

8. The assembly as recited in claim 7, further comprising a fan controller that detects a failure of a first fan and increases a speed of a second fan.

9. The assembly as recited in claim 7, further comprising a backbone printed circuit board that is mounted to said backbone wall and coupled to said hard disk drives.

10. The assembly as recited in claim 9, further comprising an interconnect printed circuit board that is located in said plenum chamber and coupled to said backbone printed circuit board.

11. A method for cooling a plurality of electronic assemblies, comprising the steps of:
   a) placing an electronic assembly into a rack chamber that is in fluid communication with a plenum chamber and a fan chamber; and,
   b) creating a flow of air from said rack chamber to said plenum chamber in a first direction and from said plenum chamber to said fan chamber in a second direction that is perpendicular to said first direction.

* * * * *